(12) United States Patent
Iwasaki

(10) Patent No.: US 6,200,853 B1
(45) Date of Patent: Mar. 13, 2001

(54) METHOD OF MANUFACTURING SEMICONDUCTOR DEVICE HAVING CAPACITOR CONTACT HOLES

(75) Inventor: Haruo Iwasaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/414,051

(22) Filed: Oct. 7, 1999

(30) Foreign Application Priority Data

Oct. 8, 1998 (JP) .................................. 10-286981
Feb. 4, 1999 (JP) .................................. 11-027942

(51) Int. Cl.[7] .............................................. H01L 21/8242
(52) U.S. Cl. ........................................ 438/253; 438/666
(58) Field of Search .......................... 438/238, 240–241, 438/253–256, 393–399, 618, 666

(56) References Cited

U.S. PATENT DOCUMENTS 5,444,005 * 8/1995 Kim et al. .
5,854,119 * 12/1998 Wu et al. .............................. 438/396

FOREIGN PATENT DOCUMENTS 3-171635 7/1991 (JP) .
9-191019 7/1997 (JP) .
9-232335 9/1997 (JP) .

* cited by examiner

Primary Examiner—Jey Tsai
(74) Attorney, Agent, or Firm—Hutchins, Wheeler & Dittmar

(57) ABSTRACT

A method of manufacturing a semiconductor device having capacitor contact holes. The method comprises: forming a first insulating film to cover the gate electrode and the source/drain electrodes; forming a second insulating film on the first insulating film; forming a third insulating film made of material different from that of the second insulating film on the second insulating film; forming a first resist film on the third insulating film; patterning the first resist film by using a first exposure mask to form a patterned first resist film; selectively removing the third insulating film by using the patterned first resist film as a mask; forming a second resist film to cover the patterned first resist film; patterning the second resist film by using a second exposure mask to form a patterned second resist film; selectively removing the first and second insulating films on at least a portion of one of the source/drain regions in each of the element forming regions by using the patterned first and second resist films as a mask to form capacitor contact holes; and forming a conductive film to fill the capacitor contact holes.

22 Claims, 16 Drawing Sheets

PRIOR ART

PRIOR ART

PRIOR ART

PRIOR ART

PRIOR ART

METHOD OF MANUFACTURING SEMICONDUCTOR DEVICE HAVING CAPACITOR CONTACT HOLES

FIELD OF THE INVENTION

The present invention relates generally to a method of manufacturing a semiconductor device having contact holes for capacitors, i.e., capacitor contact holes, such as a dynamic random access memory device and so on. More particularly, the present invention relates to a method of manufacturing a semiconductor device having contact holes for the capacitors, wherein minute capacitor contact holes can be manufactured by using exposure masks having larger holes. The present invention also relates to a semiconductor device having capacitor contact holes manufactured by such method.

BACKGROUND OF THE INVENTION

FIG. 14 illustrates a schematic cross section of a semiconductor device having contact holes for capacitors manufactured according to a conventional method. FIG. 15A through FIG. 15C, FIG. 16A through FIG. 16C and FIGS. 17A through 17C are cross sectional views illustrating, in order of manufacturing processes, the conventional method of fabricating lower electrodes of capacitors of a semiconductor device. FIG. 18 illustrates a conventional exposure mask used for fabricating capacitor contact holes.

As shown in FIG. 14, in a conventional semiconductor device 100, element forming regions are defined on a semiconductor substrate 101 by using an insulating film 102 for element isolation, i.e., an element isolation film or an element isolation insulating film. In each of the element forming regions, source/drain regions 104 and a gate region 105 are formed. Each of the source/drain regions 104 is a region used as a source region or a drain region. On the gate electrode 105, a lower electrode 111 is formed, and the lower electrode 111 is coated with a capacitor insulator film 112. Also, on the capacitor insulator film 112, there is formed an opposing electrode 113. The source/drain regions 104 are wired by using a wiring layer 114.

Now, an explanation will be made on a method of manufacturing the above-mentioned conventional semiconductor device. First, as shown in FIG. 15A, the insulating film for element isolation 102 is formed on the surface of the semiconductor substrate 101. Then, in each of the element forming regions defined by the insulating film for element isolation 102, the source/drain regions 104 and the gate electrode 105 are formed. Also, on whole surface of the semiconductor substrate 101, a first insulating film 103 is formed. Further, a first resist film 106 is formed on the first insulating film 103. The first resist film 106 is used to form a mask for forming a capacitor contact hole 108 (FIG. 16A) in the first insulating film 103.

Next, by using an exposure mask 115 shown in FIG. 18, which exposure mask has a minute opening 116, an opening portion 107 is formed by performing an exposure on the first resist film 106, after registering the opening 116 of the exposure mask 115 with the location of the capacitor contact hole 108. That is, as shown in FIG. 15B, the opening 107 of the first resist film 106 is formed at a location of the first insulating film 103 in which the capacitor contact hole 108 is to be formed.

Then, as shown in FIG. 15C, by using the first resist film 106 as a mask, portions of the first insulating film 103 are selectively removed by etching and so on.

Thereafter, the first resist film 106 is removed, and, as shown in FIG. 16A, the capacitor contact holes 108 are formed in the first insulating film 103.

As shown in FIG. 16B, a conductive film 109 is then formed on the first insulating film 103 such that the capacitor contact holes 108 are filled with the material of the conductive film 109. On the conductive film 109, a second resist film 110 is formed. The second resist film 110 is used as a mask when the conductive film 109 is patterned to form the lower electrode 111.

The second resist film 110 is exposed by using an exposure mask not shown in the drawing after registering the exposure mask with the structure already formed on the semiconductor substrate to form a resist pattern of the second resist film 110 as shown in FIG. 16C.

Next, as shown in FIG. 17A, portions of the conductive film 109 are selectively removed by etching and so on by using the resist pattern of the second resist film 110 as a mask.

Then, as shown in FIG. 17B, the remainder of the second resist film 110 are removed and the lower electrodes 111 constituted of the remainder portion of the conductive film 109 are formed.

Thereafter, an insulating film and a conductor film are sequentially formed on whole surface of the substrate, and are patterned by using photolithography and etching. Thereby, as shown in FIG. 17C, a capacitor insulator film 112 on the lower electrode 111 and an opposing electrode 113 on the capacitor insulating film 112 are formed. Then, an interlayer insulating film 117 is formed on whole surface of the substrate. At each location of the interlayer insulating film 117 corresponding to the source/drain region 104, a through hole 118 is formed by using photolithography and etching, and the like. A wiring layer 114 is formed such that the through holes 118 are filled therewith, and is patterned by using photolithography and etching, and the like. By these processes, a semiconductor device shown in FIG. 17C is fabricated.

However, in the conventional method of manufacturing a semiconductor device, minute opening patterns had to be formed in an exposure mask 115 to fabricate minute capacitor contact holes, i.e., contact holes for coupling capacitor electrodes 111 with the drain/source regions 104. Since the size of each opening of the exposure mask was very small and resist patterns formed on a substrate by using such exposure mask was also very small, it was difficult to obtain sufficient exposure margin. Therefore, it was difficult to realize high yield of semiconductor manufacturing.

SUMMARY OF THE INVENTION

It is an object of the present invention to obviate the above-mentioned problems of the conventional method of manufacturing a semiconductor device having contact holes for capacitors.

It is another object of the present invention to provide a novel method of manufacturing a semiconductor device having contact holes for capacitors, in which an exposure mask having openings or holes of larger size can be used, thereby improving manufacturing yield of the semiconductor device.

It is still another object of the present invention to provide a novel method of manufacturing a semiconductor device having contact holes for capacitors, in which minute contact holes can be manufactured by using an exposure mask having openings or holes of larger size and by forming, in resist films, openings or holes which have larger size than that of the contact holes, thereby improving manufacturing yield of the semiconductor device.

According to one aspect of the present invention, there is provided a method of manufacturing a semiconductor device having capacitor contact holes, comprising: preparing a semiconductor substrate; forming an element isolation insulating film on the semiconductor substrate; forming at least a gate electrode and source/drain regions in each of element forming regions defined by the element isolation insulating film; forming a first insulating film to cover the gate electrode and the source/drain electrodes; forming a second insulating film on the first insulating film; forming a third insulating film made of material different from that of the second insulating film on the second insulating film; forming a first resist film on the third insulating film; patterning the first resist film by using a first exposure mask to form a patterned first resist film; selectively removing the third insulating film by using the patterned first resist film as a mask; forming a second resist film to cover the patterned first resist film; patterning the second resist film by using a second exposure mask to form a patterned second resist film; selectively removing the first and second insulating films on at least a portion of one of the source/drain regions in each of the element forming regions by using the patterned first and second resist films as a mask to form capacitor contact holes; and forming a conductive film to fill the capacitor contact holes.

Preferably, the above-mentioned method further comprises: removing remaining the first and second resist films, after forming the capacitor contact holes and before forming a conductive film to fill the capacitor contact holes.

It is also preferable that the above-mentioned method further comprises: removing remaining third insulating film, after the forming a conductive film to fill the capacitor contact holes.

It is also preferable that the above-mentioned method further comprises: baking remaining first resist film at a high temperature, after selectively removing the third insulating film and before forming the second resist film.

In the above-mentioned method, each of the first and second insulating films can be an oxide film.

Also, in the above-mentioned method, the second insulating film can be a nitride film.

It is also preferable that, in the selectively removing said third insulating film, the second insulating film functions as an etching stopper.

Further, it is preferable that, in the patterning the first resist film, opening portions are formed in the first resist film, wherein, in the patterning the second resist film, opening portions are formed in the second resist film, and wherein regions corresponding to the opening portions in the first resist film partially overlap with regions corresponding to the opening portions in the second resist film, and the capacitor contact holes are formed at portions where the regions corresponding to the opening portions in the first resist film and the regions corresponding to the opening portions in the second resist film overlap with each other.

It is also preferable that the regions corresponding to the opening portions in the first resist film correspond to regions where lower electrodes of capacitors are formed.

It is further preferable that each of the first and second exposure masks has openings for passing light, and the openings of the first exposure mask and the openings of the second exposure mask partially overlap with each other assuming that both the first exposure mask and the second exposure mask are superimposed.

According to another aspect of the present invention, there is provided a semiconductor device having capacitor contact holes manufactured by the above-mentioned method.

According to still another aspect of the present invention, there is provided a method of manufacturing a semiconductor device having capacitor contact holes, comprising: preparing a semiconductor substrate; forming an element isolation insulating film on the semiconductor substrate; forming at least a gate electrode and source/drain regions in each of element forming regions defined by the element isolation insulating film; forming a first insulating film to cover the gate electrode and the source/drain electrodes; forming a second insulating film on the first insulating film; forming a third insulating film made of material different from that of the second insulating film on the second insulating film; forming a metal film on the third insulating film; forming a first resist film on the metal film; patterning the first resist film by using a first exposure mask to form a patterned first resist film; selectively removing the metal film by using the patterned first resist film as a mask to form a patterned metal film; removing remaining the first resist film; selectively removing the third insulating film by using the patterned metal film as a mask; forming a second resist film to cover the patterned metal film; patterning the second resist film by using a second exposure mask to form a patterned second resist film; selectively removing the first and second insulating films on at least a portion of one of the source/drain regions in each of the element forming regions by using the patterned second resist films and the patterned metal film as a mask to form capacitor contact holes; and forming a conductive film to fill the capacitor contact holes.

It is preferable that the above-mentioned method further comprises: removing remaining the second resist film, after forming the capacitor contact holes and before forming a conductive film to fill the capacitor contact holes.

It is also preferable that the above-mentioned method further comprises: removing remaining the third insulating film, after the forming a conductive film to fill the capacitor contact holes.

In the above-mentioned method, each of the first and third insulating films can be an oxide film.

Also, in the above-mentioned method, the second insulating film can be a nitride film.

Further, in the above-mentioned method, the metal film can be a polysilicon film.

In the above-mentioned method, it is preferable that, in the selectively removing the third insulating film, the second insulating film functions as an etching stopper.

It is preferable that, in the patterning the first resist film, opening portions are formed in the first resist film, wherein, in the patterning the second resist film, opening portions are formed in the second resist film, and wherein regions corresponding to the opening portions in the first resist film partially overlap with regions corresponding to the opening portions in the second resist film, and the capacitor contact holes are formed at portions where the regions corresponding to the opening portions in the first resist film and the regions corresponding to said opening portions in the second resist film overlap with each other.

It is preferable that the regions corresponding to the opening portions in the first resist film correspond to regions where lower electrodes of capacitors are formed.

It is also preferable that each of the first and second exposure masks has openings for passing light, and the openings of the first exposure mask and the openings of the second exposure mask partially overlap with each other assuming that both the first exposure mask and the second exposure mask are superimposed.

According to still another aspect of the present invention, there is provided a semiconductor device having capacitor contact holes manufactured by the above-mentioned method.

In the present invention, two exposure masks are used to form resist patterns used as an etching mask when forming capacitor contact holes, and thereby area of each of holes in the exposure masks can be larger than that of each hole of the conventional exposure mask.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which.

DESCRIPTION OF A PREFERRED EMBODIMENT

Figure 1:
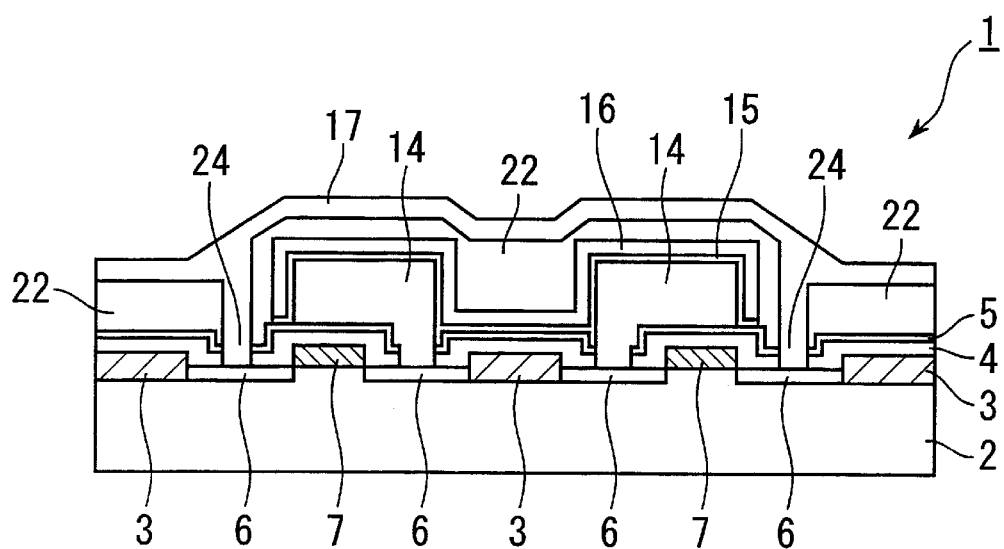
FIG. 1 is a schematic cross sectional view illustrating a semiconductor device having capacitor contact holes manufactured by methods according to a first embodiment and a second embodiment.
Figure 6:
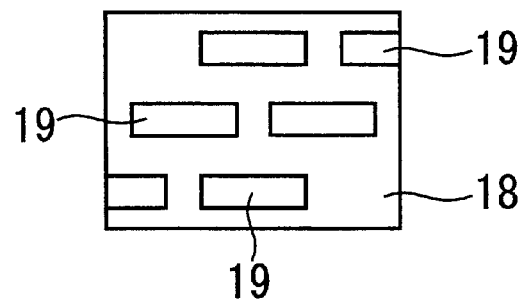
FIG. 6 is a schematic plan view showing a part of a first exposure mask used for manufacturing semiconductor devices having capacitor contact holes according to methods of a first embodiment and a second embodiment of the present invention.
Figure 7:
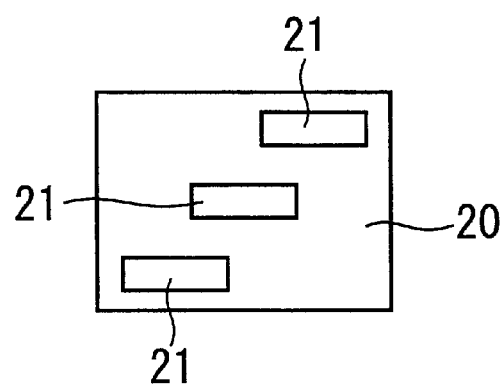
FIG. 7 is a schematic plan view showing a part of a second exposure mask used for manufacturing semiconductor devices having capacitor contact holes according to the methods of a first embodiment and a second embodiment of the present invention.

With reference to the attached drawings, embodiments of the present invention will now be explained in detail. FIG. 1 illustrates a schematic cross section of a semiconductor device, for example, a dynamic random access memory (DRAM) device having a capacitor in each memory cell, manufactured by using a method according to a first embodiment of the present invention. FIG. 2A through FIG. 2C, FIG. 3A through FIG. 3C, FIG. 4A through FIG. 4C and FIG. 5A through 5C illustrate, in order of process steps, schematic cross sections of a semiconductor device at respective stages of manufacturing according to the method of the first embodiment. FIG. 6 illustrates a first exposure mask used for forming patterns of a first resist film in the method according to the first embodiment of the present invention. FIG. 7 illustrates a second exposure mask used for forming patterns of a second resist film in the method according to the first embodiment of the present invention.

As shown in FIG. 1, in the semiconductor device manufactured by the method according to the first embodiment, element forming regions are defined on the surface of a semiconductor substrate 2 by an element isolation insulating film 3. In each of the element forming regions, source/drain regions 6 and a gate electrode 7 are formed. Each of the source/drain regions 6 is a region used as a source region or a drain region. On the source/drain regions 6 and the gate electrode 7, there is formed a first insulating film 4, and on the first insulating film 4, a nitride film 5 is formed by the chemical vapor deposition, which is hereafter referred to as CVD. Further, on the nitride film 5, lower electrodes 14 for capacitors are patterned and formed, and a capacitor insulating film 15 is formed on the lower electrodes 14 so as to cover them. Each of the lower electrodes 14 is electrically coupled to one of the source/drain regions 6 in the element forming region through a capacitor contact hole formed through the nitride film 5 and the first insulating film 4. Also, an opposing electrode 16 is formed on the capacitor insulating film 15 so as to cover it. The other source/drain region 6 in the element forming region is electrically coupled to a wiring layer 17 via a through hole 24 formed through an interlayer insulating film 22.

Figure 2A:
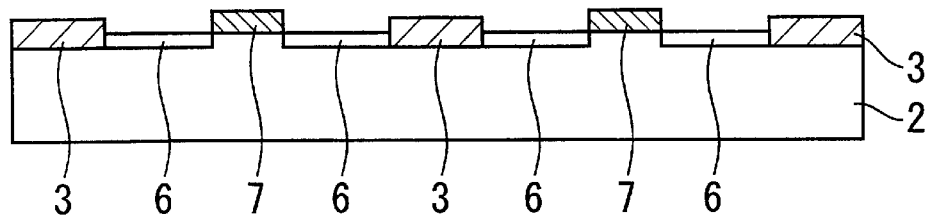
FIG. 2A through FIG. 2C are schematic cross sectional views illustrating, in order of process steps, a method of manufacturing a semiconductor device having capacitor contact holes according to a first embodiment of the present invention, and showing cross sections of the semiconductor device obtained after finishing respective process steps during manufacturing.

Now, explanation will be made, in order of process steps, on a method of manufacturing a semiconductor device according to the first embodiment of the present invention. First, as shown in FIG. 2A, element isolation insulating films 3 made, for example, of silicon oxide are formed by using, for example, a LOCOS (Local Oxidation of Silicon) method. Then, in each of element isolation regions defined by the element isolation insulating film 3, a thin gate oxide film not shown in the drawing is formed. Thereafter, for example, a polycrystalline silicon (polysilicon) layer and a tungsten silicide layer are sequentially formed on the gate oxide film, and are patterned by using photolithography and etching. Thereby, a gate electrode 7 made, for example, of polysilicon and tungsten silicide is formed on the gate oxide film in each of the element forming regions. Then, source/drain regions 6 are formed in each of the element forming region, by performing ion implantation, using the gate electrode 7 as a mask. If necessary, it is possible to form oxide film sidewall spacers on the sidewalls of each gate electrode 7.

Figure 2B:
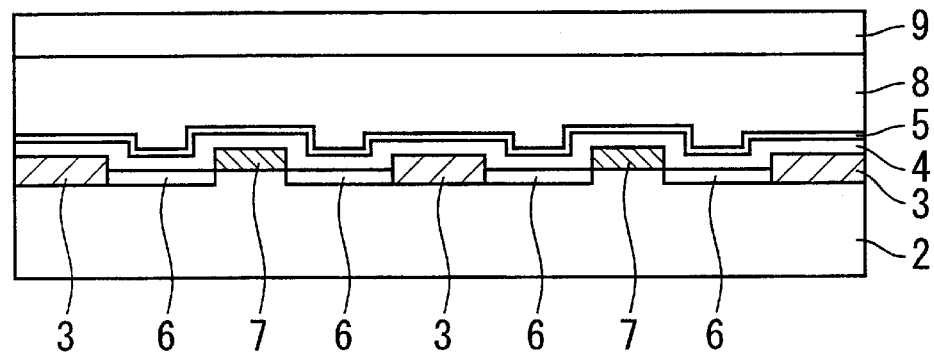

Further, as shown in FIG. 2B, on whole surface of the substrate, a first insulating film 4 made, for example, of silicon oxide are formed, and, on the first insulating film 4, a nitride film 5 is formed by using, for example, the CVD method. Then, on the nitride film 5, a second insulating film 8 of, for example, silicon oxide is formed. Thereafter, a first resist film 9, which is, for example, a photo resist film, is formed on the second insulating film 8.

Figure 2C:
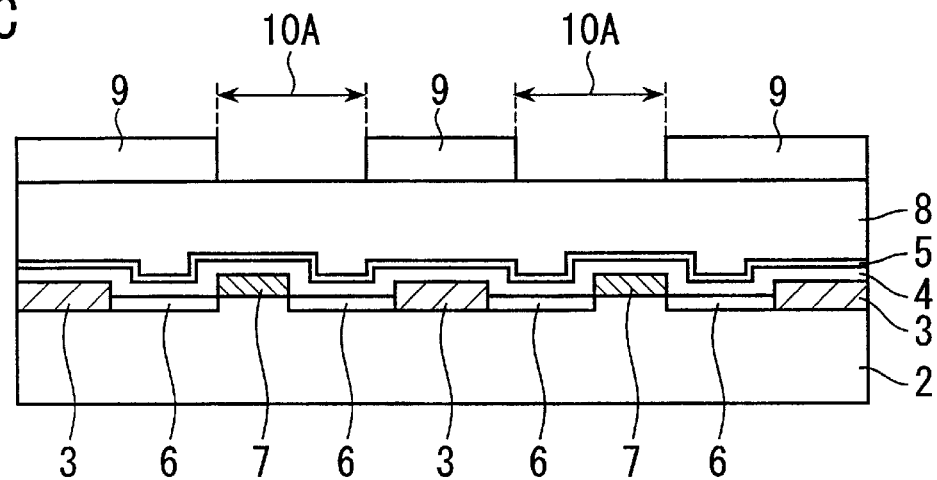

The first resist film 9 is then exposed via a first exposure mask 18 which has holes or openings 19 having rectangular shape as shown in FIG. 6, after registering the first exposure mask 18 with the structure already formed on the semiconductor substrate 2. The first resist film 9 which is partially exposed by a light passed through the holes 19 of the first exposure mask 18 is developed to form opening portions 10A in the first resist film 9 as shown in FIG. 2C. It should be noted that the opening portions 10A of the first resist film 9 are located on the regions in which the lower electrodes 14 are to be formed. Thereby, patterning of the first resist film 9 is completed.

Figure 3A:
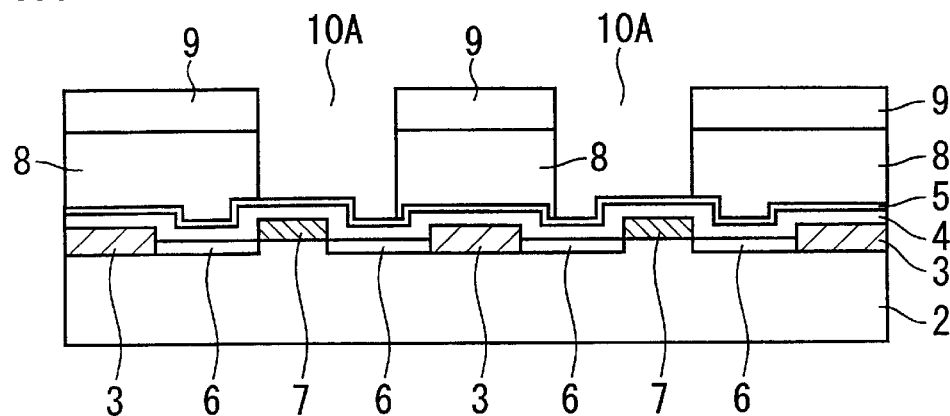
FIGS. 3A through 3C are schematic cross sectional views showing, in order of process steps, cross sections obtained after performing further process steps on the semiconductor device structure shown in FIG. 2C.

Then, as shown in FIG. 3A, portions of the second insulating film 8 which are exposed via the opening portions 10A are selectively removed by etching, by using the patterned first resist film 9 as a mask. In this process, it should be noted that the nitride film 5 functions as an etching stopper. Therefore, the nitride film 5 can be a film made of material other than nitride, if the material has an etching rate sufficiently different from that of the second insulating film 8. Usually, it is preferable that the nitride film 5 and the second insulating film 8 are made of different materials. Thereafter, the first resist film 9 is hardened by using high temperature baking. Thereby, it becomes possible to prevent the first resist film 9 from mixing with a second resist film 11 which will be described below.

Figure 3B:
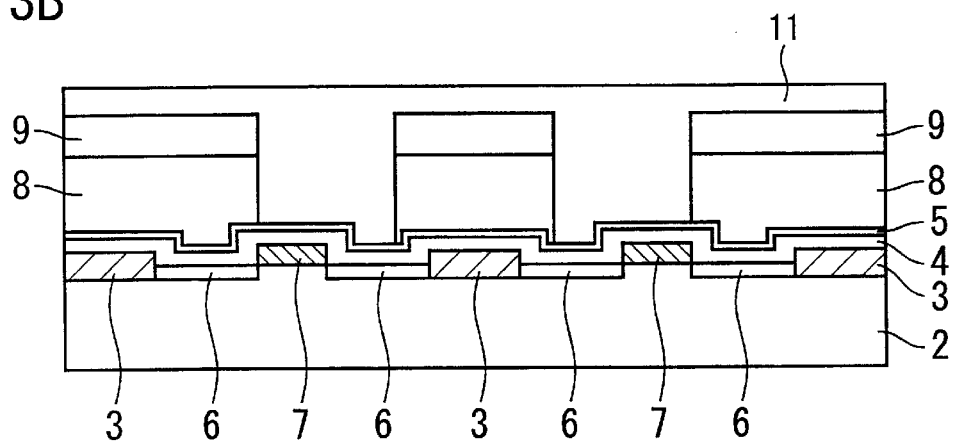
Figure 3C:
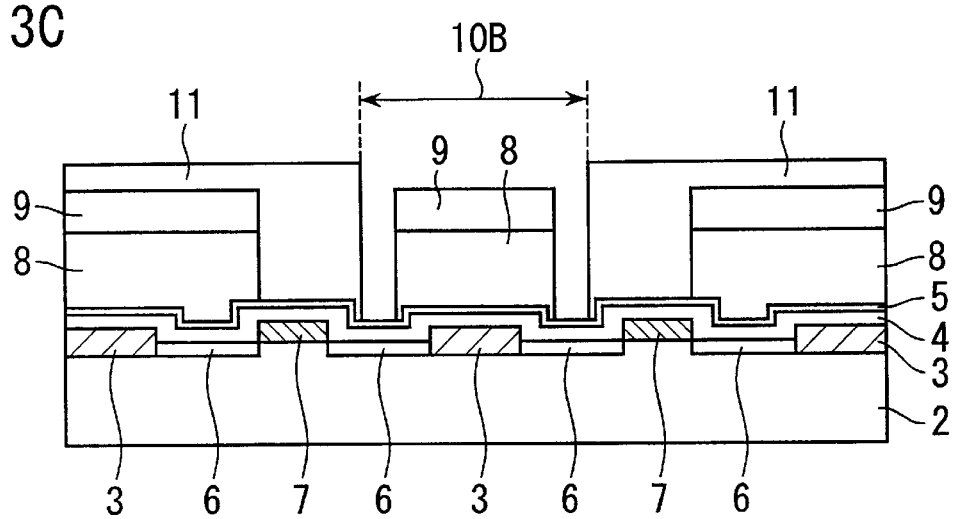
Figure 8:
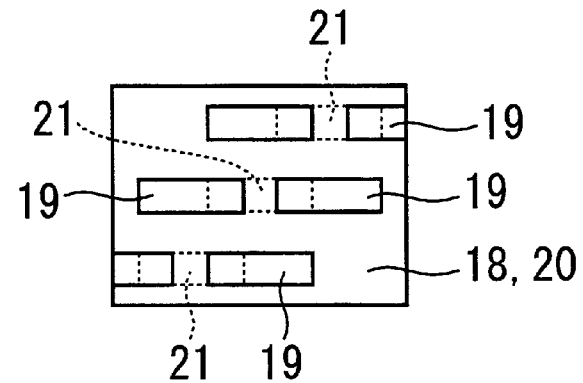
FIG. 8 is a schematic plan view showing a positional relation between the first exposure mask shown in FIG. 6 and the second exposure mask shown in FIG. 7, assuming both exposure masks are superimposed.

Next, as shown in FIG. 3B, a resist material, for example, a photo resist material, is newly applied to cover the first resist film 9 by spin coating to form the second resist film 11. It should be noted that, in this condition, the opening portions 10A formed in the second insulating film 8 and the first resist film 9 are filled with the material of the second resist film 11. The second resist film 11 is exposed by using a second exposure mask 20 having openings or holes 21 as shown in FIG. 7, after registering the second exposure mask 20 with the structure already formed. FIG. 8 shows a relation between locations of the holes 19 of the first exposure mask 18 and the holes 21 of the second exposure mask 20, assuming that the first exposure mask 18 and the second exposure mask 20 are superimposed together. It should be noted that the holes 21 match the areas between the holes 19, and the holes 21 and the holes 19 partially overlap with each other. The second resist film 11 which is partially exposed by a light passed through the holes 21 of the second exposure mask 20 is developed to form opening portions 10B in the second resist film 11. Thereby, patterning of the second resist film 11 is completed as shown in FIG. 3C. In this condition, on the second insulating film 8 within the opening 10B, only the first resist film 9 baked at a high temperature remains.

Figure 4A:
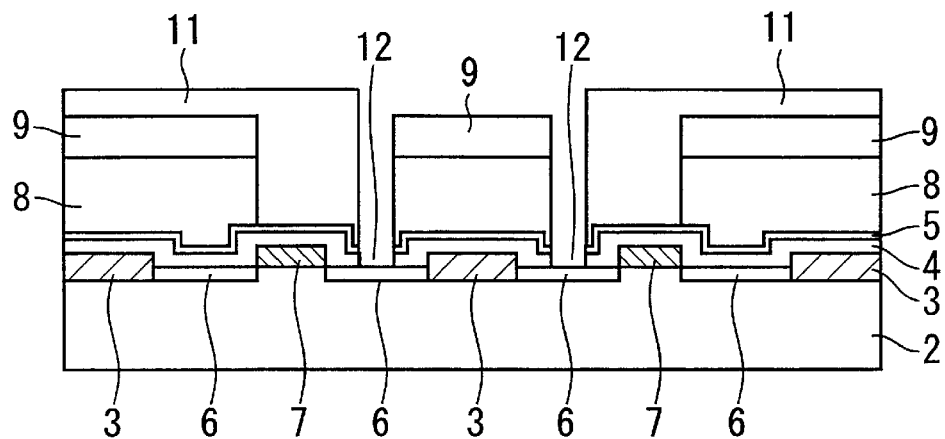
FIGS. 4A through 4C are schematic cross sectional views showing, in order of process steps, cross sections obtained after performing further process steps on the semiconductor device structure shown in FIG. 3C.

As shown in FIG. 4A, the nitride film 5 and the first insulating film 4 are dry etched by using the patterned second resist film 11 and the first resist film portion 9 remained and exposed within the opening 10B as an etching mask. Thereby, the nitride film 5 and the first insulating film 4 are selectively removed and the capacitor contact holes 12 are formed. It should be noted that the capacitor contact holes 12 are formed in the regions where the opening portion 10A and the opening portion 10B overlap with each other.

Figure 4B:
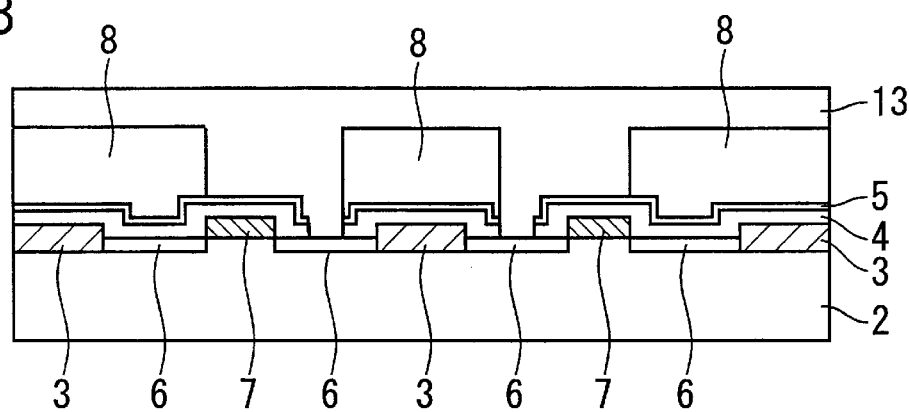

Then, the remainder of the first resist film 9 and the second resist film 11 is removed. Thereafter, as shown in FIG. 4B, a conductor film 13 of, for example, polysilicon is formed on whole surface of the substrate such that the opening portions 10A of the second insulating film 8 and the capacitor contact holes 12 are filled therewith.

Figure 4C:
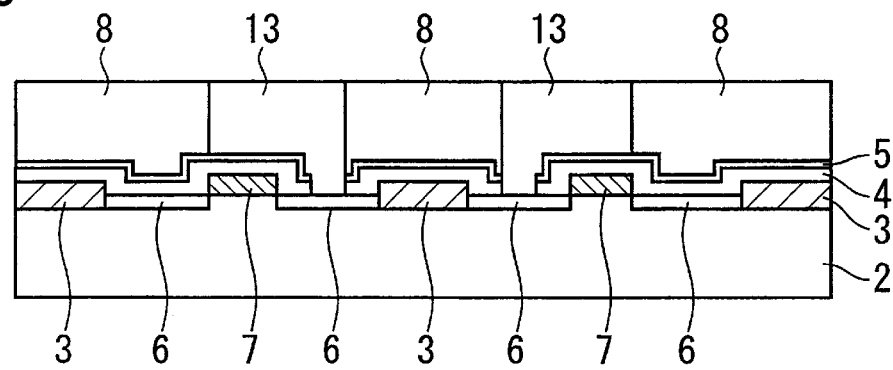

As shown in FIG. 4C, surface of the substrate is then planarized by etching back, and the second insulating film 8 is exposed. In place of etching back, it is possible to use CMP (Chemical Mechanical Polishing).

Figure 5A:
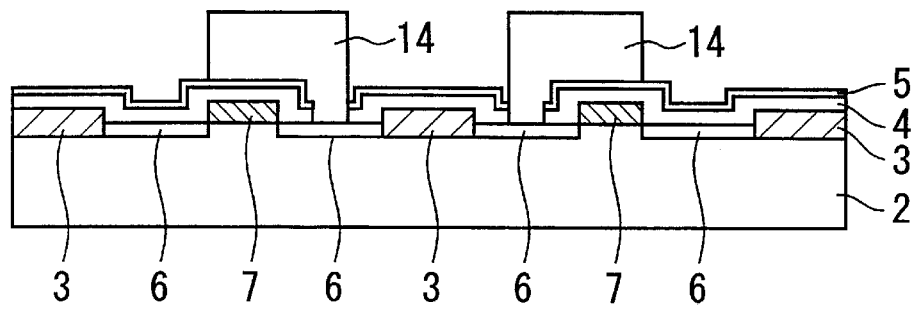
FIGS. 5A through 5C are schematic cross sectional views showing, in order of process steps, cross sections obtained after performing further process steps on the semiconductor device structure shown in FIG. 4C.

As shown in FIG. 5A, the second insulating film 8 which remains and is exposed is removed by, for example, hydrofluoric acid. Also in this process, the nitride film 5 functions as an etching stopper. Thereby, the lower electrodes 14 constituted of the remaining conductor film portions 13 are formed.

Figure 5B:
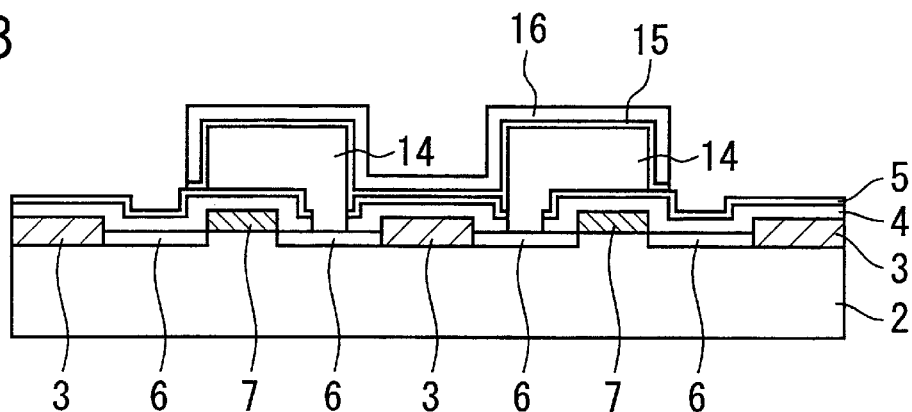
Figure 5C:
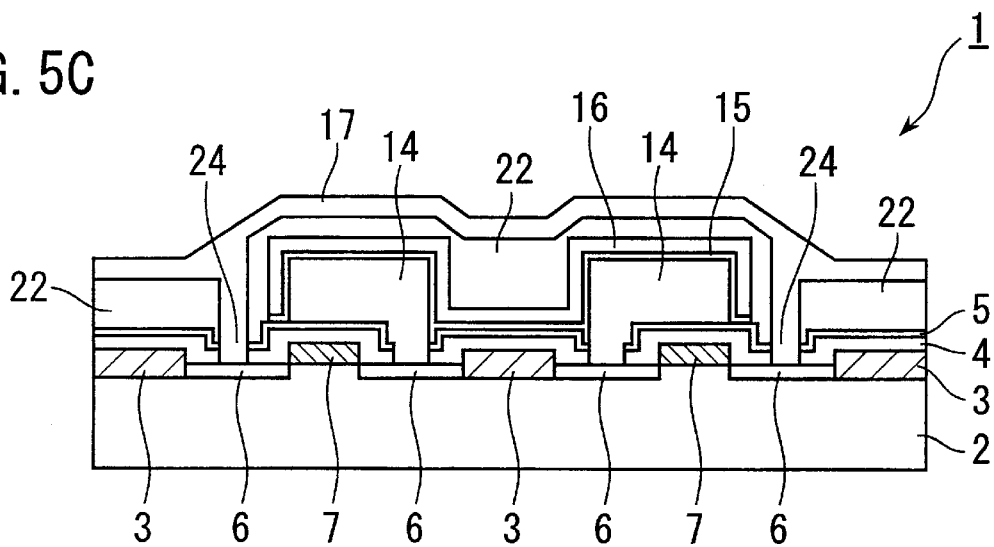

Next, an insulating film of, for example, silicon oxide, and a conductor film are sequentially formed on whole surface of the substrate, and are patterned by using photolithography and etching. Thereby, as shown in FIG. 5B, a capacitor insulating film 15 and an opposing electrode 16 on the capacitor insulating film 15 are formed so as to cover each lower electrode 14. Then, an interlayer insulating film 22 is formed on whole surface of the substrate. The interlayer insulating film 22, the nitride film 5 and the first insulating film 4 on a part of one of the source/drain regions 6 in each of the element forming regions are selectively removed by photolithography and etching. Thereby, as shown in FIG. 5C, a through hole 24 is formed at a location matching with one of the source/drain regions 6 in each of the element forming regions. A conductive layer is then formed on whole surface of the substrate so as to fill the through holes 24 of the interlayer insulating film 22, the nitride film 5 and the first insulating film 4, and is patterned by using photolithography and etching to form a wiring layer 17. The wiring layer 17 and the source/drain layers 6 are electrically coupled via the through holes 24. By these process steps, the semiconductor device 1 having capacitor contact holes as shown in FIG. 1 (FIG. 5C) is fabricated.

Figure 18:
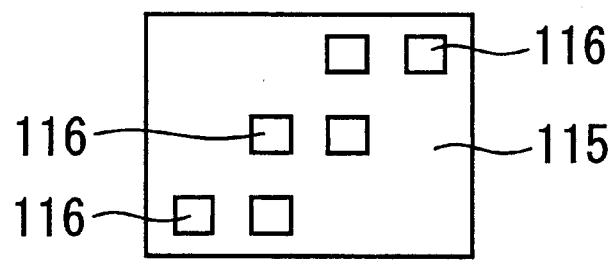
FIG. 18 is a schematic plan view showing a part of an exposure mask used for manufacturing a semiconductor device having capacitor contact holes according to a conventional method.

In this embodiment, the first resist film 9 on the second insulating film 8 is exposed and developed by using a first exposure mask 18 as shown in FIG. 6, after registering the first exposure mask 18 with the underlying substrate. The exposure mask 18 has rectangular shaped holes 19 whose long side is, for example, 0.65 micrometer in length and whose short side is, for example, 0.2 micrometer in length. In the first resist film 9, openings are formed at regions where the lower electrodes 14 are to be formed, thereby the first resist patterns are formed, i.e., patterning of the first resist film 9 is completed. Then, a resist material is newly applied to cover the first resist film 9 by spin coating to form the second resist film 11. In this embodiment, the second exposure mask 20 as shown in FIG. 7 is used. If it is supposed that the first exposure mask 18 and the second exposure mask 20 are superimposed together, two holes 19 of the first exposure mask 18 and one hole 21 of the second exposure mask 20 partially overlap with each other and are located continuously. The second resist film 11 is exposed and developed by using such second exposure mask 20, after registering the second exposure mask 20 with the underlying substrate structure. Thereby, the second resist film 11 is patterned to form openings at the portions including locations where the capacitor contact holes are to be formed. That is, the second resist patterns are formed. By using the first and second resist patterns as an etching mask, the capacitor contact holes 12 are formed in the nitride film 5 and the first insulating film 4. Thus, the first exposure mask 18 and the second exposure mask 20 are used, and each of the capacitor contact holes 12 is formed only at a region corresponding to the overlapped portion of the opening 10A formed by the first exposure mask 18 and the opening 10B formed by the second exposure mask 20. Therefore, the area of each hole 19 in the first exposure mask 18 and the area of each hole in the second exposure mask 20 can be larger than the area of each hole 116 in the conventional exposure mask 115 shown in FIG. 18.

In this embodiment, the second exposure mask 20 shown in FIG. 7 has rectangular holes 21, in each of which a long side is, for example, 0.55 micrometer in length and a short side is, for example, 0.2 micrometer in length.

Figure 9:
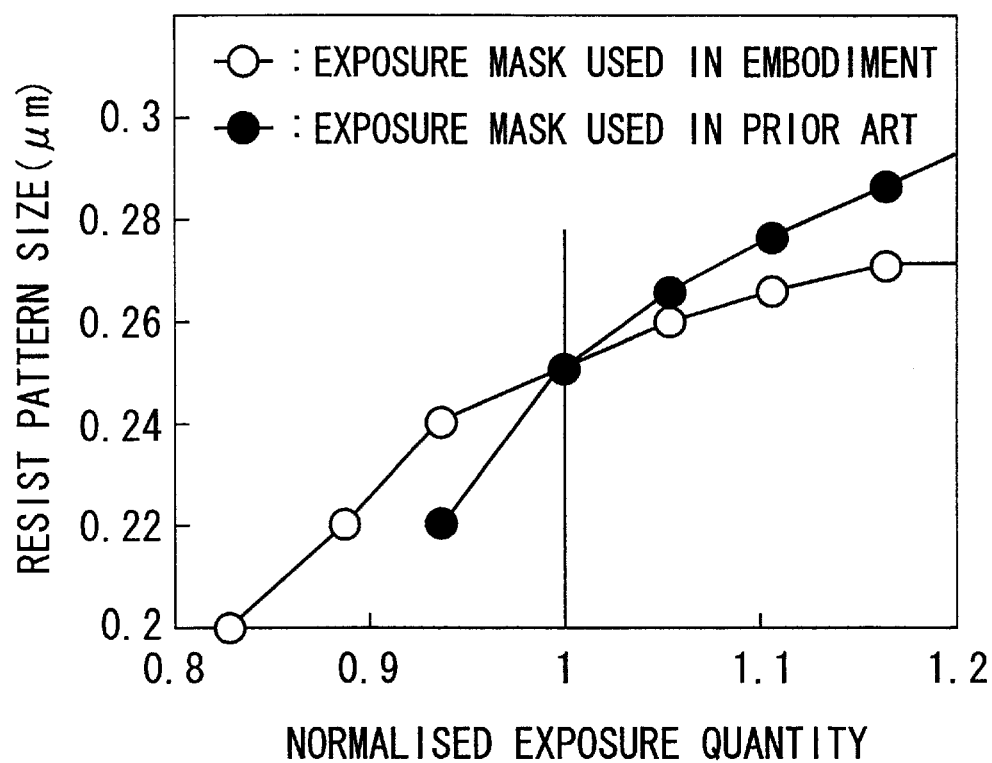
FIG. 9 is a graph showing relations between sizes of resist patterns formed and quantities of exposure, when resist films are exposed by using exposure masks used in the conventional method and in the method according to the present invention.

FIG. 9 is a graph in which sizes of resist patterns formed are plotted with respect to quantity of exposure, when the resist patterns are formed by using the exposure mask 18 or 20 according to the present invention and the conventional exposure mask 115. An ordinate designates sizes of short sides of the resist patterns formed, that is, sizes of short sides of the openings formed in the resist film, and an abscissa designates normalized quantity of exposure. From this graph, it is possible to compare exposure margin of the exposure mask according to the present invention and exposure margin of the conventional exposure mask. An exposure margin corresponds to an inverse of a slope of a curve in this graph, that is, a ratio of variation of quantity of exposure to variation of resist pattern size. It can be seen that the slope of the curve when the exposure mask of the present invention is used is smaller than that of the curve when the conventional exposure mask is used. Therefore, when the exposure mask of this embodiment is used, even if the quantity of exposure somewhat varies, the size of the resist pattern formed does not vary too much. On the other hand, when the conventional exposure mask is used, if the quantity of exposure varies, the size of the resist pattern varies largely. That is, the exposure margin of the exposure mask according to the present invention is larger than that of the conventional exposure mask. As a result, when the resist patterns for forming the capacitor contact holes 12 are to be formed, it is possible, by using the exposure mask according to the present invention, to obtain wider exposure margin than that of the conventional exposure mask.

Also, in the above-mentioned embodiment, various methods are used to form films in various process steps. However, the present invention is not limited to using such methods mentioned above, but it is possible to select and use various other appropriate methods to form the films mentioned above.

With reference to FIG. 10A through FIG. 10C, FIG. 11A through FIG. 11C, FIG. 12A through FIG. 12C and FIGS. 13A through 13C, a second embodiment of the present invention will now be described in detail. These drawings illustrate, in order of process steps, schematic cross sections of a semiconductor device having capacitor contact holes at respective stages of manufacturing according to the method of the second embodiment. In these drawings, like reference symbols are applied to the same parts as those of the first embodiment shown in FIG. 1, FIG. 2A through FIG. 2C, FIG. 3A through FIG. 3C, FIG. 4A through FIG. 4C and FIGS. 5A through 5C, and detailed description thereof is omitted here.

Figure 10A:
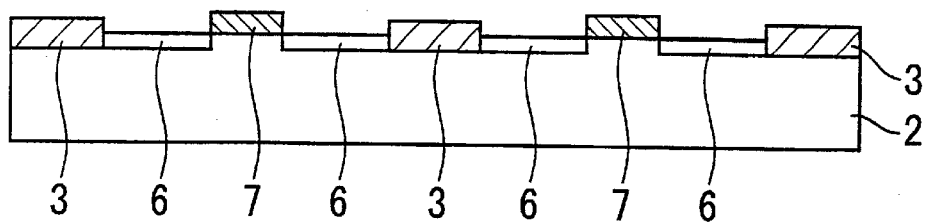
FIG. 10A through FIG. 10C are schematic cross sectional views illustrating, in order of process steps, a method of manufacturing a semiconductor device having capacitor contact holes according to a second embodiment of the present invention, and showing cross sections of the semiconductor device obtained after finishing respective process steps during manufacturing.

The method of the second embodiment differs from that of the first embodiment in that, in the method of the second embodiment, a metal film 23 is formed on the second insulating film 8. Other process steps are the same as those of the first embodiment. That is, as shown in FIG. 10A, an element isolation insulating film 3 made, for example, of silicon oxide is formed by using, for example, a LOCOS (Local Oxidation of Silicon) method. Then, in each of element isolation regions defined by the element isolation insulating film 3, a thin gate oxide film not shown in the drawing is formed. Thereafter, for example, a polycrystalline silicon (polysilicon) layer and a tungsten silicide layer are sequentially formed on the gate oxide film, and are patterned by using photolithography and etching. Thereby, a gate electrode 7 made, for example, of polysilicon and tungsten silicide is formed on the gate oxide film in each of the element forming regions. Then, source/drain regions 6 are formed in each of the element forming region, by performing ion implantation using the gate electrode 7 as a mask. If necessary, it is possible to form oxide film sidewall spacers on the sidewalls of each gate electrode 7.

Figure 10B:
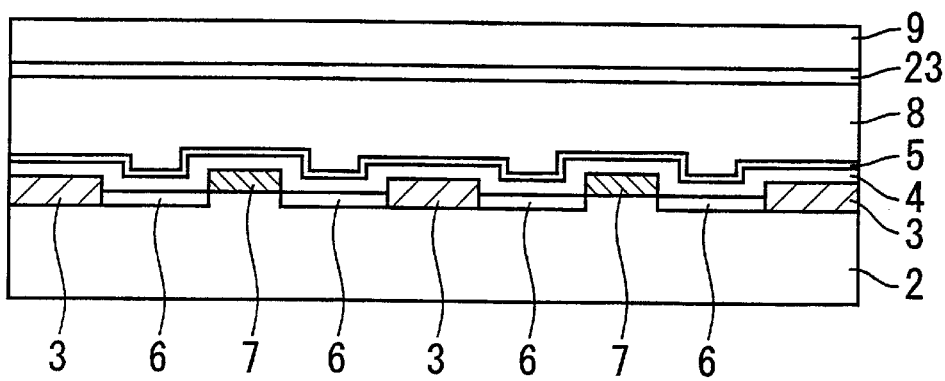

Further, as shown in FIG. 10B, on whole surface of the substrate, a first insulating film 4 made, for example, of silicon oxide are formed, and, on the first insulating film 4, a nitride film 5 is formed by using, for example, the CVD method. Then, on the nitride film 5, a second insulating film 8 of, for example, silicon oxide is formed. Thereafter, differently from the first embodiment, a metal film 23 of, for example, polysilicon is formed on the second insulating film 8, in this embodiment. On this metal film 23, a first resist film 9 is formed.

Figure 10C:
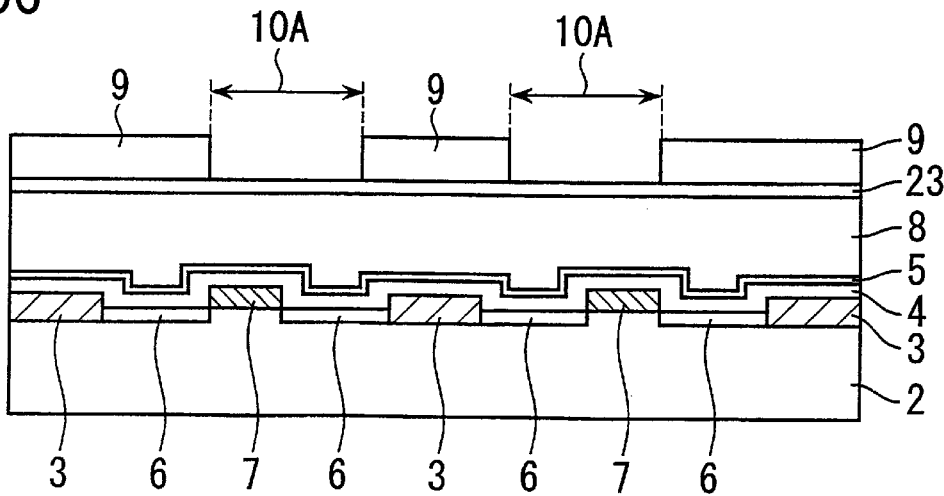

Then, in a manner similar to the first embodiment, the first resist film 9 is then exposed via a first exposure mask 18 which has holes or openings 19 having rectangular shape as shown in FIG. 6, after registering the first exposure mask 18 with the structure already formed on the semiconductor substrate 2. The first resist film 9 which is partially exposed by a light passed through the holes 19 of the first exposure mask 18 is developed to form opening portions 10A in the first resist film 9, as shown in FIG. 10C. It should be noted that the opening portions 10A of the first resist film 9 are located on the regions in which the lower electrodes 14 are to be formed. Thereby, patterning of the first resist film 9 is completed.

Figure 11A:
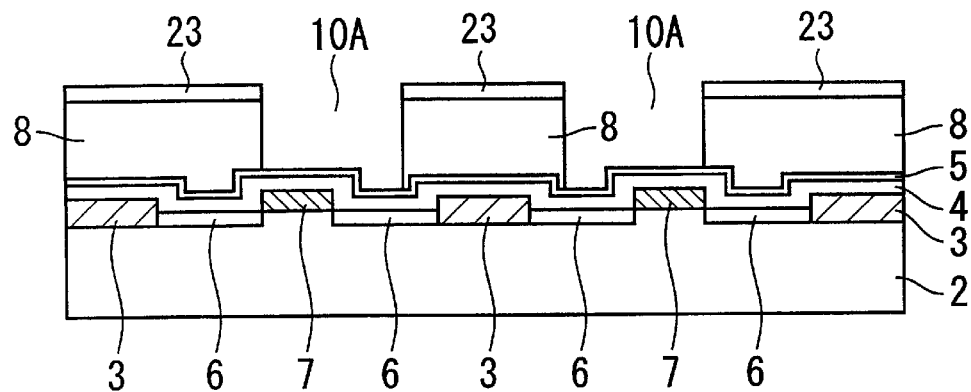
FIGS. 11A through 11C are schematic cross sectional views showing, in order of process steps, cross sections obtained after performing further process steps on the semiconductor device structure shown in FIG. 10C.

Thereafter, by using the patterned first resist film 9, i.e., the first resist pattern, as a mask, portions of the metal film 23 which are exposed via opening portions of the first resist pattern are selectively removed by etching. Thereafter, the first resist film 9 is removed, and, by using the patterned metal film 23 as an etching mask, the second insulating film 8 is selectively removed by etching as shown in FIG. 11A. In this process, it should be noted that the nitride film 5 functions as an etching stopper. Therefore, the nitride film 5 can be a film made of material other than nitride, if the material has an etching rate sufficiently different from that of the second insulating film 8. Usually, it is preferable that the nitride film 5 and the second insulating film 8 are made of different materials.

Figure 11B:
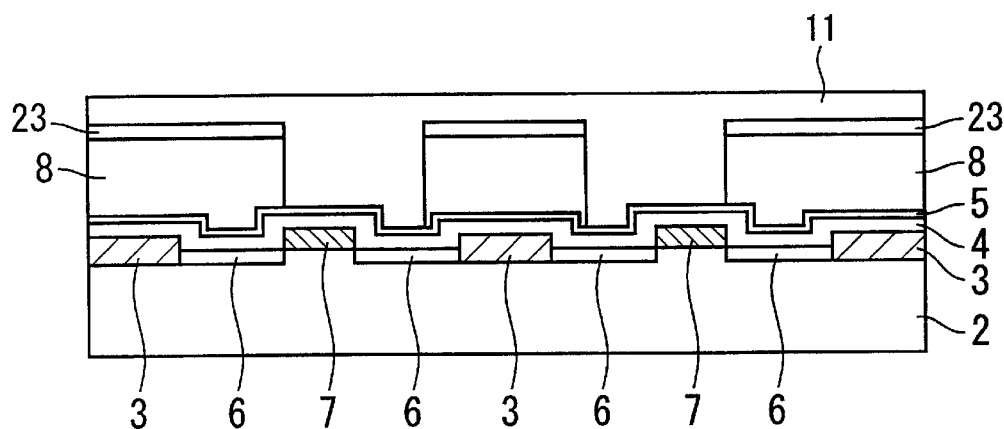
Figure 11C:
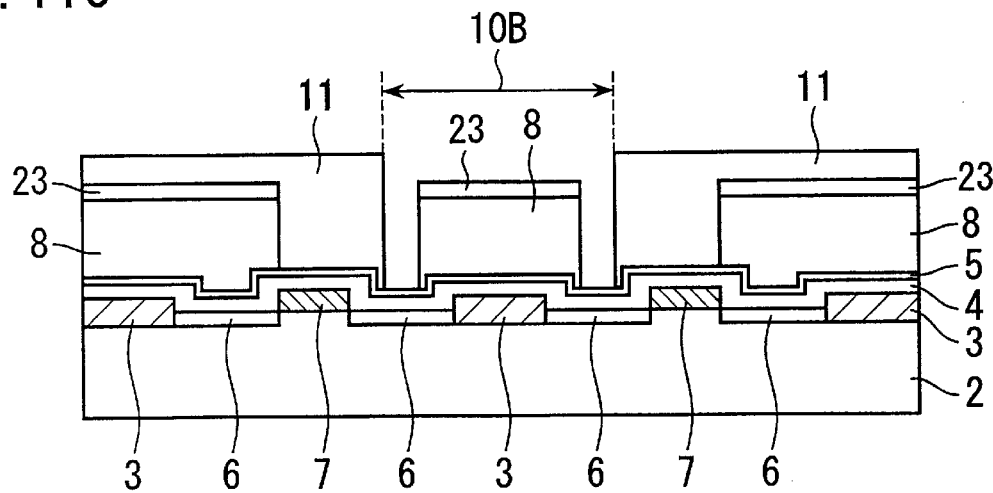

Next, as shown in FIG. 11B, a resist material is newly applied to cover the metal film 23 by spin coating to form the second resist film 11. It should be noted that, in this condition, the opening portions 10A formed in the second insulating film 8 and the first resist film 9 are filled with the material of the second resist film 11. The second resist film 11 is exposed by using a second exposure mask 20 having openings or holes 21 as shown in FIG. 7, after registering the second exposure mask 20 with the structure already formed. The second resist film 11 which is partially exposed by a light passed through the holes 21 of the second exposure mask 20 is developed to form opening portions 10B in the second resist film 11. Thereby, patterning of the second resist film 11 is completed as shown in FIG. 11C. In this condition, in any of openings 10A, the second resist film 11 exists at a portion other than the region in which the capacitor contact hole 12 is to be formed. On the second insulating film 8 existing between the openings 10A, only the metal film 23 is formed.

Figure 12A:
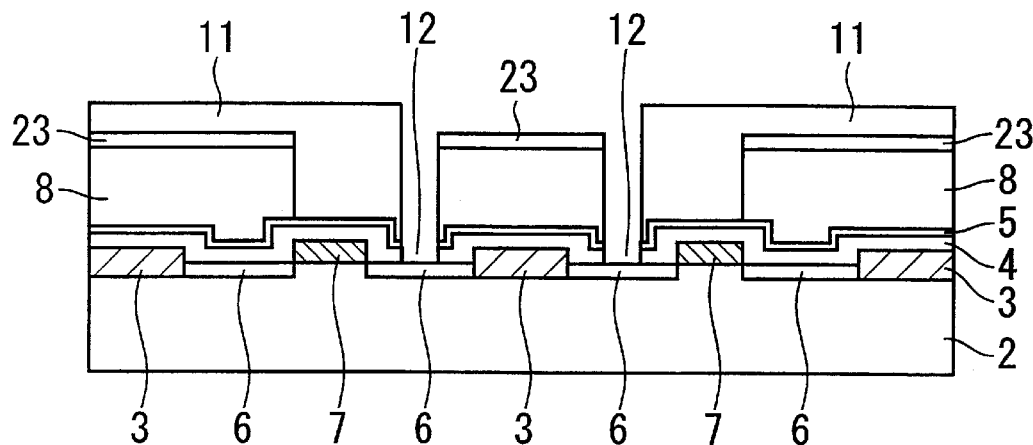
FIGS. 12A through 12C are schematic cross sectional views showing, in order of process steps, cross sections obtained after performing further process steps on the semiconductor device structure shown in FIG. 11C.

As shown in FIG. 12A, the nitride film 5 and the first insulating film 4 is dry etched by using the metal film 23 and the patterned second resist film 11, i.e., the second resist pattern, as an etching mask. Thereby, the nitride film 5 and the first insulating film 4 are selectively removed and capacitor contact holes 12 are formed.

Figure 12B:
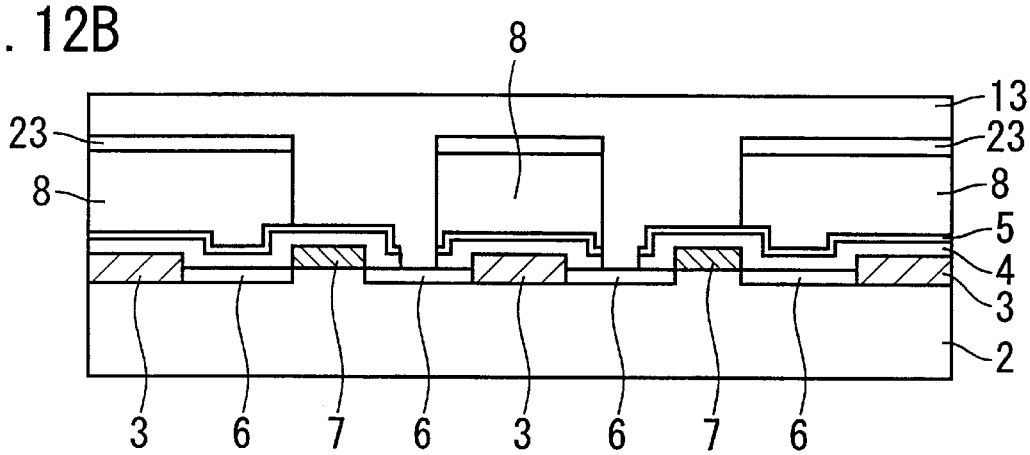

As shown in FIG. 12B, the second resist film 11 is removed. Then, conductive material, for example, polysilicon and the like, is applied on whole surface of the substrate to form a conductive film 13 such that the opening portions 10A of the second insulating film 8 and the metal film 23 and the capacitor contact holes 12 are filled with the conductive material.

Figure 12C:
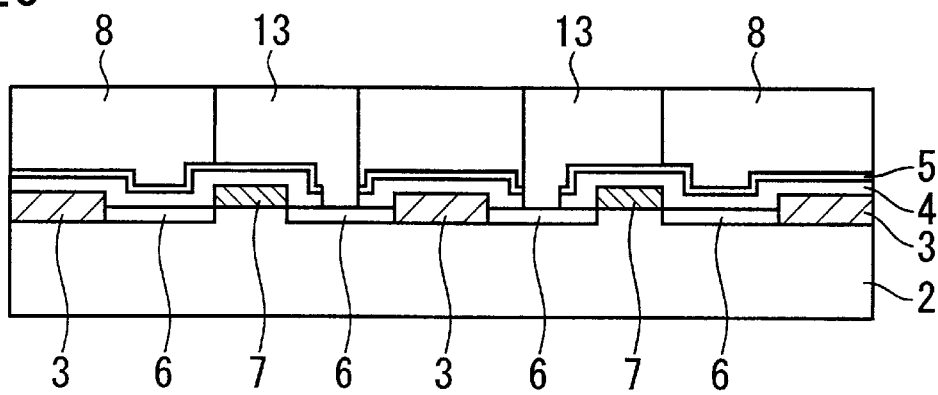

Next, as shown in FIG. 12C, the metal film 23 and the conductive film 13 are etched back, and the surface portion is planarized. In this case, it is possible to use CMP in place of etchback.

The process steps hereafter may be similar to those of the first embodiment.

Figure 13A:
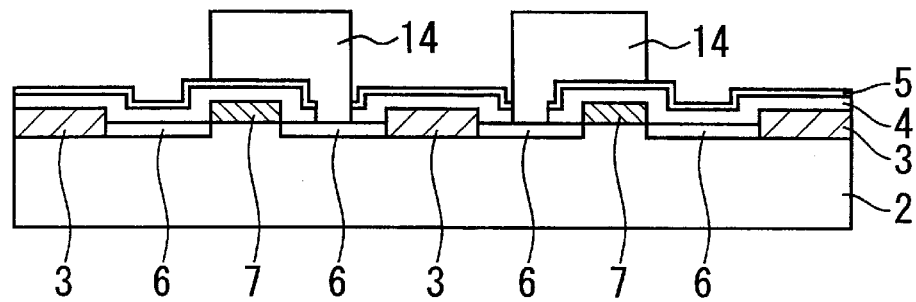
FIGS. 13A through 13C are schematic cross sectional views showing, in order of process steps, cross sections obtained after performing further process steps on the semiconductor device structure shown in FIG. 12C.

That is, as shown in FIG. 13A, by using the nitride film 5 as an etching stopper, remaining and exposed second insulating film 8 is removed by, for example, hydrofluoric acid. Thereby, lower electrodes 14 comprising remaining conductive film portions 13 are formed.

Figure 13B:
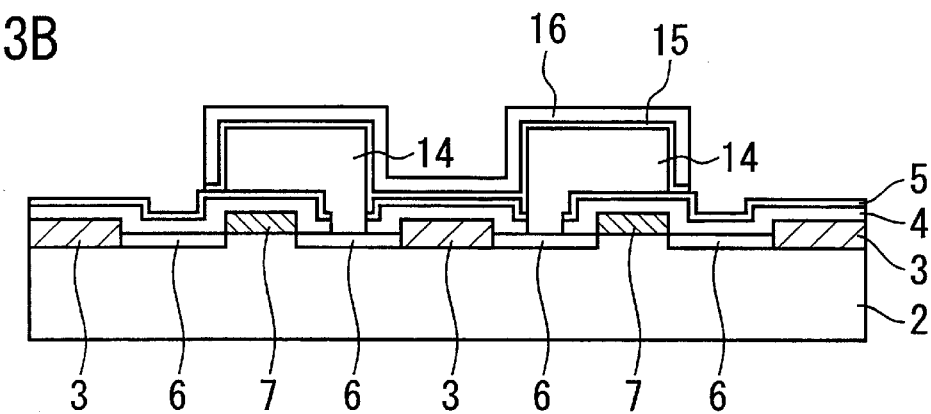

Next, an insulating film of, for example, silicon oxide, and a conductor film are sequentially formed on whole surface of the substrate, and are patterned by using photolithography and etching. Thereby, as shown in FIG. 13B, a capacitor insulating film 15 and an opposing electrode 16 on the capacitor insulating film 15 are formed so as to cover each lower electrode 14.

Figure 13C:
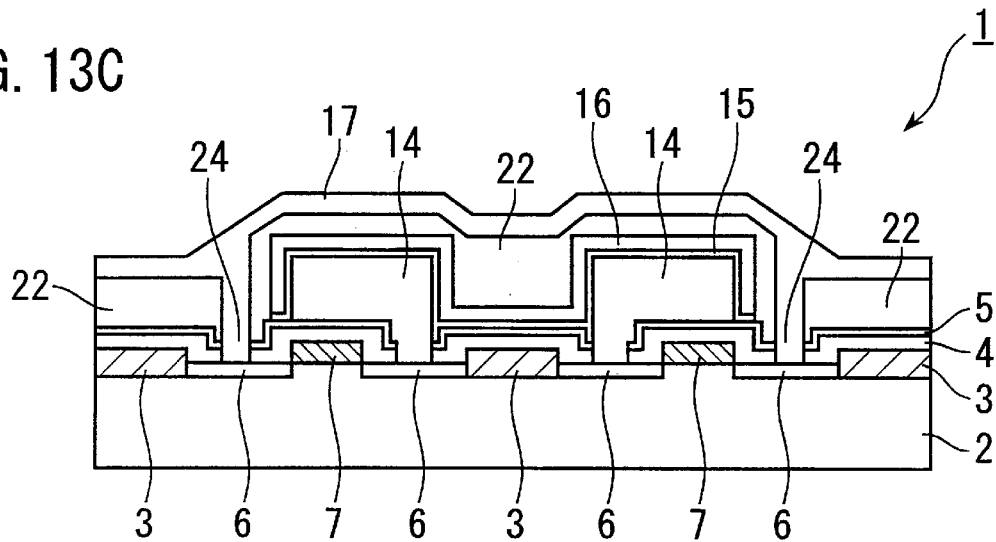
Figure 14:
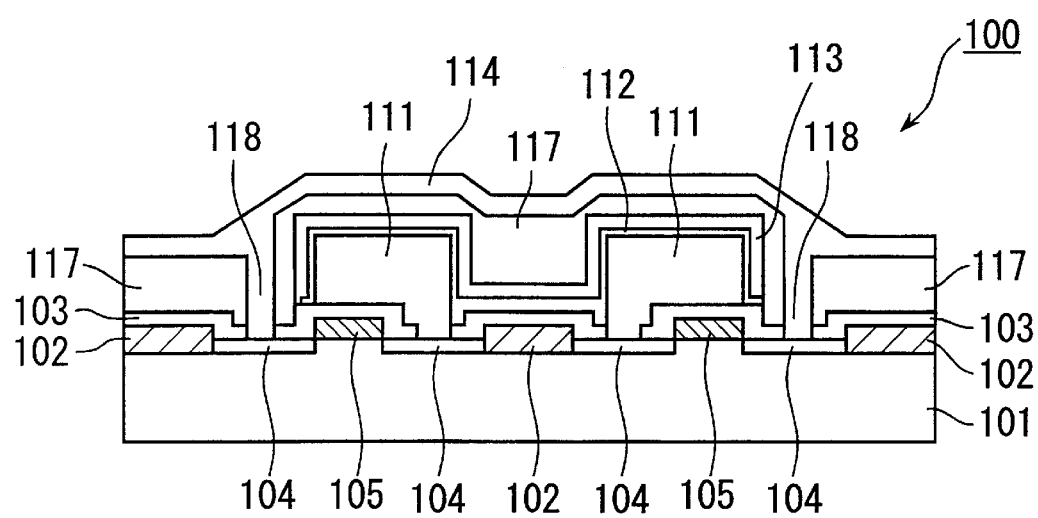
FIG. 14 is a schematic cross sectional view illustrating a semiconductor device having capacitor contact holes manufactured by a conventional method.
Figure 15A:
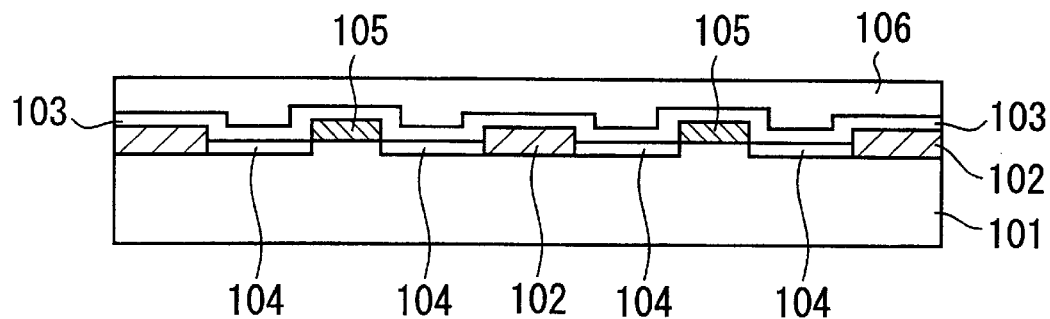
FIG. 15A through FIG. 15C are schematic cross sectional views illustrating, in order of process steps, a conventional method of manufacturing a semiconductor device having capacitor contact holes, and showing cross sections of the semiconductor device obtained after finishing respective process steps during manufacturing.
Figure 15B:
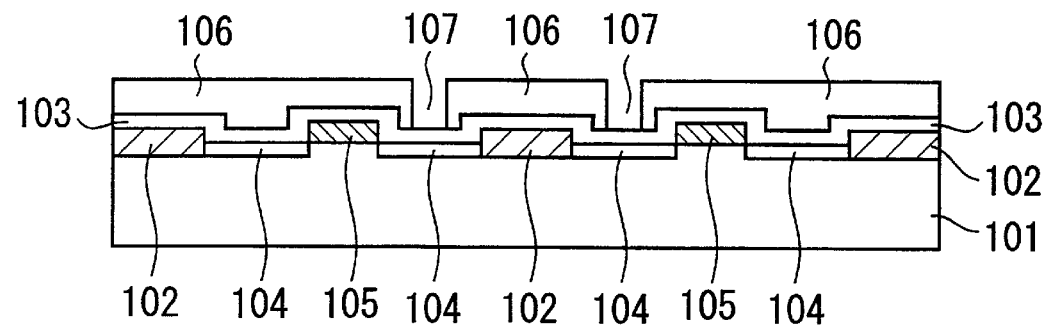
Figure 15C:
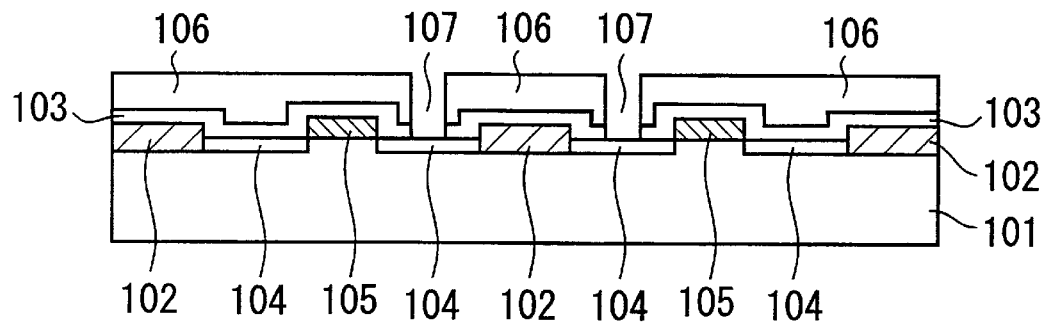
Figure 16A:
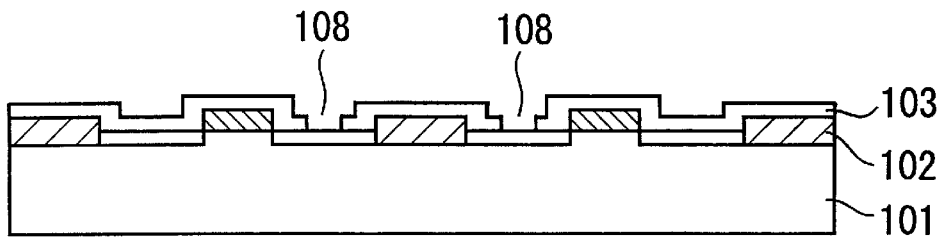
FIGS. 16A through 16C are schematic cross sectional views showing, in order of process steps, cross sections obtained after performing further process steps on the semiconductor device structure shown in FIG. 15C.
Figure 16B:
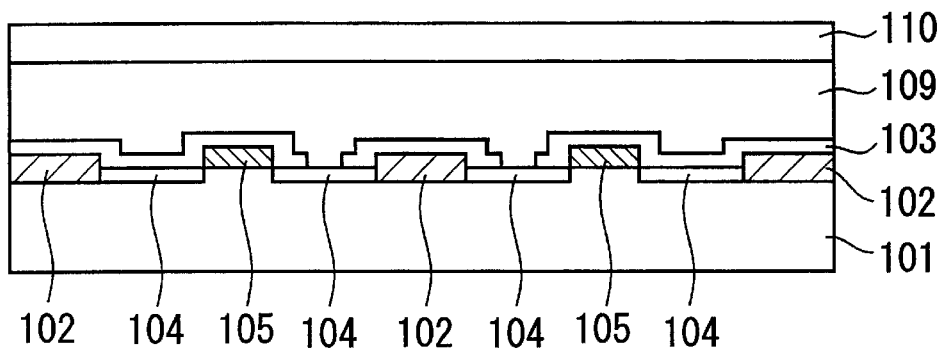
Figure 16C:
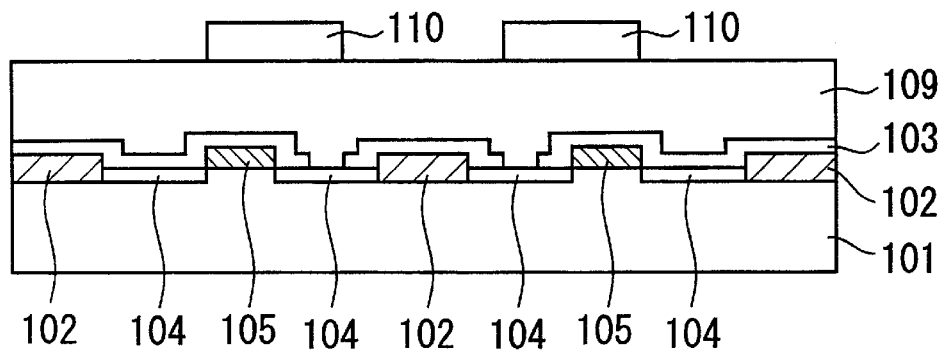
Figure 17A:
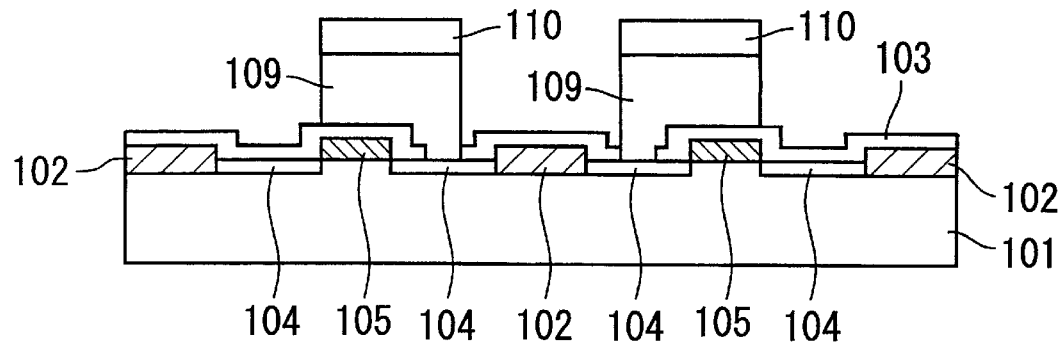
FIGS. 17A through 17C are schematic cross sectional views showing, in order of process steps, cross sections obtained after performing further process steps on the semiconductor device structure shown in FIG. 16C.
Figure 17B:
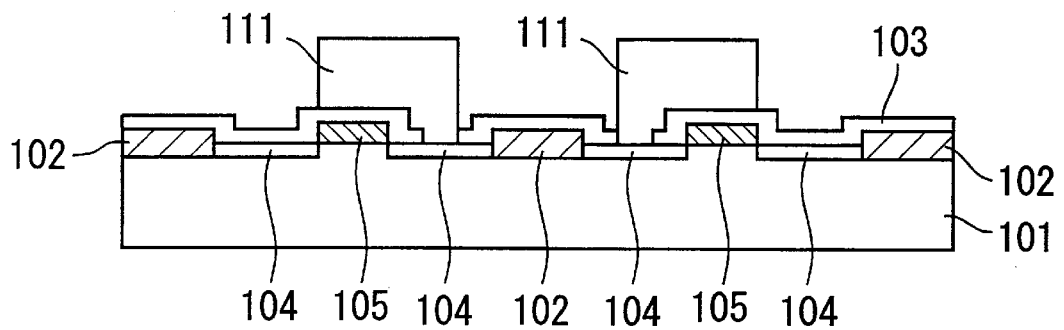
Figure 17C:
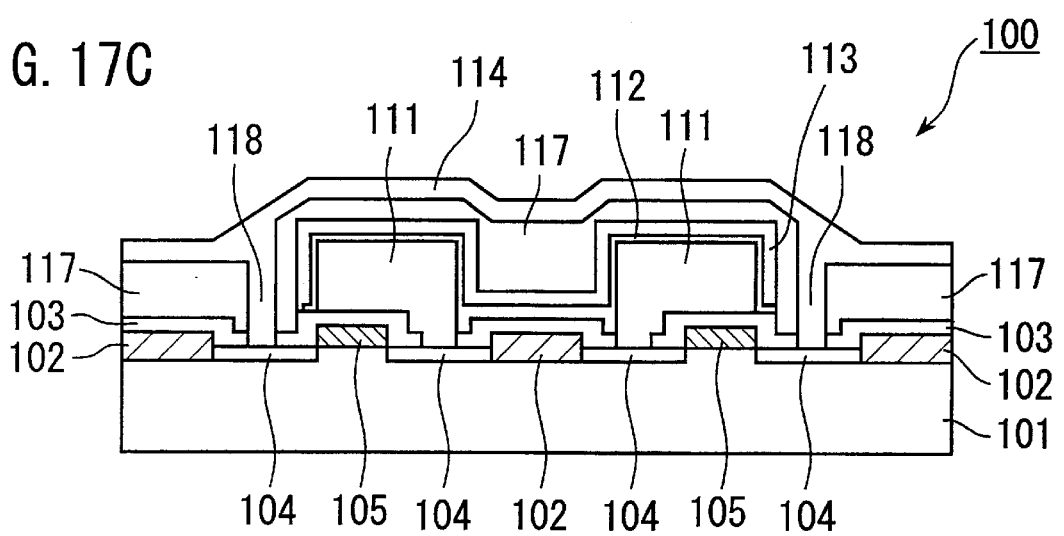

Then, an interlayer insulating film 22 is formed on whole surface of the substrate. The interlayer insulating film 22, the nitride film 5 and the first insulating film 4 on a part of one of the source/drain regions 6 in each of the element forming regions are selectively removed by photolithography and etching. Thereby, a through hole 24 is formed at a location matching with one of the source/drain regions 6 in each of the element forming regions. A conductive layer is then formed on whole surface of the substrate so as to fill the through holes 24 of the interlayer insulating film 22, the nitride film 5 and the first insulating film 4, and is patterned by using photolithography and etching to form a wiring layer 17. The wiring layer 17 and the source/drain layers 6 are electrically coupled via the through holes 24. By these process steps, similarly to the first embodiment, the semiconductor device 1 having capacitor contact holes as shown in FIG. 13C is fabricated, in this embodiment.

In the second embodiment, the capacitor contact holes 12 are opened by using the metal film 23 and the second resist film 11 as an etching mask. Therefore, similarly to the first embodiment, in the patterning process of the resist film necessary for forming the capacitor contact holes, it is possible to use the first and second exposure masks 18 and 20 having large holes 19 and 21, respectively. Therefore, exposure margin when the first and second resist films 9 and 11 are patterned can be increased and manufacturing yield of the semiconductor device 1 can be improved.

Also, in the second embodiment, it is only necessary for the first resist film 9 to withstand etching process once. Therefore, it is possible to make the first resist film 9 thinner in the second embodiment than that in the first embodiment. Further, etching selectivity of silicon oxide with respect to polysilicon is generally larger than etching selectivity of silicon oxide with respect to photo resist. Therefore, the metal film 23 in the second embodiment can be thinner than the first resist film 9 in the first embodiment. As a result, the second resist film 11 in the second embodiment can be thinner than the second resist film 11 in the first embodiment, by the amount corresponding to the difference between the thickness of the first resist film 9 in the first embodiment and the thickness of the metal film 23 in the second embodiment. Therefore, in the second embodiment, it is possible to resolve the first and second resist patterns by using small quantity of exposure. Thus, it is possible to stably, i.e., with small dispersion, form capacitor contact hole patterns, and to improve a manufacturing yield of the semiconductor device 1. Also, in the second embodiment, process for baking the first resist film 9 at a high temperature is not required.

In this embodiment, similarly to the first embodiment, the first resist film 9 is exposed and developed by using a first exposure mask 18 as shown in FIG. 6, after registering the first exposure mask 18 with the underlying substrate. The exposure mask 18 has rectangular shaped holes 19 whose long side is, for example, 0.65 micrometer in length and whose short side is, for example, 0.2 micrometer in length. In the first resist film 9 formed on the metal film 23, openings are formed at regions where the lower electrodes 14 are to be formed, thereby the first resist patterns are formed, i.e., patterning of the first resist film 9 is completed. The metal film 23 is selectively removed by using the first resist patterns as an etching mask. Then, the first resist film 9 is removed. Then, a resist material is newly applied to cover the metal film 23 by spin coating to form the second resist film 11. In this embodiment, the second exposure mask 20 as shown in FIG. 7 is used. If it is assumed that the first exposure mask 18 and the second exposure mask 20 are superimposed together, two holes 19 of the first exposure mask 18 and one hole 21 of the second exposure mask 20 partially overlap with each other and are located continuously. The second resist film 11 is exposed and developed by using such second exposure mask 20, after registering the second exposure mask 20 with the underlying substrate structure. Thereby, the second resist film 11 is patterned to form openings at the portions including locations where the capacitor contact holes are to be formed. That is, the second resist patterns are formed. By using the second resist pattern and the metal film 23 as an etching mask, the capacitor contact holes 12 are formed in the nitride film 5 and the first insulating film 4. Thus, the first exposure mask 18 and the second exposure mask 20 are used, and each of the capacitor contact holes 12 is formed only at a region corresponding to the overlapped portion of the opening 10A formed by the first exposure mask 18 and the opening 10B formed by the second exposure mask 20. Therefore, similarly to the first embodiment, the area of each hole 19 in the first exposure mask 18 and the area of each hole in the second exposure mask 20 can be larger than the area of each hole 116 in the conventional exposure mask 115 shown in FIG. 18.

Also, in the above-mentioned embodiment, various methods are used to form films in various process steps. However, the present invention is not limited to using such methods mentioned above, but it is possible to select and use various other appropriate methods to form the films mentioned above.

As mentioned above in detail, in the present invention, two exposure masks are used to form resist patterns necessary for forming capacitor contact holes, and thereby area of each of holes in the exposure masks can be larger than that of each hole of the conventional exposure mask. Therefore, in the process of forming resist patterns necessary for forming the capacitor contact holes, wide exposure margin can be obtained. Thereby, it is possible to avoid deterioration of manufacturing yield of a semiconductor device having capacitor contact holes.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are to be included within the scope of the present invention. Therefore, it is intended that this invention encompasses all of the variations and modifications as fall within the scope of the appended claims.

What is claimed is:

1. A method of manufacturing a semiconductor device having capacitor contact holes, comprising:
    preparing a semiconductor substrate;
    forming an element isolation insulating film on said semiconductor substrate;
    forming at least a gate electrode and source/drain regions in each of element forming regions defined by said element isolation insulating film;
    forming a first insulating film to cover said gate electrode and said source/drain electrodes;
    forming a second insulating film on said first insulating film;
    forming a third insulating film made of material different from that of said second insulating film on said second insulating film;
    forming a first resist film on said third insulating film;
    patterning said first resist film by using a first exposure mask to form a patterned first resist film;
    selectively removing said third insulating film by using said patterned first resist film as a mask;
    forming a second resist film to cover said patterned first resist film;
    patterning said second resist film by using a second exposure mask to form a patterned second resist film;
    selectively removing said first and second insulating films on at least a portion of one of said source/drain regions in each of said element forming regions by using said patterned first and second resist films as a mask to form capacitor contact holes; and
    forming a conductive film to fill said capacitor contact holes.

2. A method of manufacturing a semiconductor device having capacitor contact holes as set forth in claim 1, further comprising: removing remaining said first and second resist films, after forming said capacitor contact holes and before forming a conductive film to fill said capacitor contact holes.

3. A method of manufacturing a semiconductor device having capacitor contact holes as set forth in claim 1, further comprising: removing remaining said third insulating film, after said forming a conductive film to fill said capacitor contact holes.

4. A method of manufacturing a semiconductor device having capacitor contact holes as set forth in claim 1, further comprising: baking remaining said first resist film at a high temperature, after selectively removing said third insulating film and before forming said second resist film.

5. A method of manufacturing a semiconductor device having capacitor contact holes as set forth in claim 1, wherein each of said first and second insulating films is an oxide film.

6. A method of manufacturing a semiconductor device having capacitor contact holes as set forth in claim 1, wherein said second insulating films is a nitride film.

7. A method of manufacturing a semiconductor device having capacitor contact holes as set forth in claim 1, wherein, in said selectively removing said third insulating film, said second insulating film functions as an etching stopper.

8. A method of manufacturing a semiconductor device having capacitor contact holes as set forth in claim 1, wherein, in said patterning said first resist film, opening portions are formed in said first resist film, wherein, in said patterning said second resist film, opening portions are formed in said second resist film, and wherein regions corresponding to said opening portions in said first resist film partially overlap with regions corresponding to said opening portions in said second resist film, and said capacitor contact holes are formed at portions where said regions corresponding to said opening portions in said first resist film and said regions corresponding to said opening portions in said second resist film overlap with each other.

9. A method of manufacturing a semiconductor device having capacitor contact holes as set forth in claim 8, wherein said regions corresponding to said opening portions in said first resist film correspond to regions where lower electrodes of capacitors are formed.

10. A method of manufacturing a semiconductor device having capacitor contact holes as set forth in claim 1, wherein each of said first and second exposure masks has openings for passing light, and said openings of said first exposure mask and said openings of said second exposure mask partially overlap with each other assuming that both said first exposure mask and said second exposure mask are superimposed.

11. A method of manufacturing a semiconductor device having capacitor contact holes, comprising:

preparing a semiconductor substrate;

forming an element isolation insulating film on said semiconductor substrate;

forming at least a gate electrode and source/drain regions in each of element forming regions defined by said element isolation insulating film;

forming a first insulating film to cover said gate electrode and said source/drain electrodes;

forming a second insulating film on said first insulating film;

forming a third insulating film made of material different from that of said second insulating film on said second insulating film;

forming a metal film on said third insulating film;

forming a first resist film on said metal film;

patterning said first resist film by using a first exposure mask to form a patterned first resist film;

selectively removing said metal film by using said patterned first resist film as a mask to form a patterned metal film;

removing remaining said first resist film;

selectively removing said third insulating film by using said patterned metal film as a mask;

forming a second resist film to cover said patterned metal film;

patterning said second resist film by using a second exposure mask to form a patterned second resist film;

selectively removing said first and second insulating films on at least a portion of one of said source/drain regions in each of said element forming regions by using said patterned second resist film and said patterned metal film as a mask to form capacitor contact holes; and forming a conductive film to fill said capacitor contact holes.

12. A method of manufacturing a semiconductor device having capacitor contact holes as set forth in claim 11, further comprising: removing remaining said second resist film, after forming said capacitor contact holes and before forming a conductive film to fill said capacitor contact holes.

13. A method of manufacturing a semiconductor device having capacitor contact holes as set forth in claim 11, further comprising: removing remaining said third insulating film, after said forming a conductive film to fill said capacitor contact holes.

14. A method of manufacturing a semiconductor device having capacitor contact holes as set forth in claim 11, wherein each of said first and third insulating films is an oxide film.

15. A method of manufacturing a semiconductor device having capacitor contact holes as set forth in claim 11, wherein said second insulating film is a nitride film.

16. A method of manufacturing a semiconductor device having capacitor contact holes as set forth in claim 11, wherein said metal film is a polysilicon film.

17. A method of manufacturing a semiconductor device having capacitor contact holes as set forth in claim 11, wherein, in said selectively removing said third insulating film, said second insulating film functions as an etching stopper.

18. A method of manufacturing a semiconductor device having capacitor contact holes as set forth in claim 11, wherein, in said patterning said first resist film, opening portions are formed in said first resist film, wherein, in said patterning said second resist film, opening portions are formed in said second resist film, and wherein regions corresponding to said opening portions in said first resist film partially overlap with regions corresponding to said opening portions in said second resist film, and said capacitor contact holes are formed at portions where said regions corresponding to said opening portions in said first resist film and said regions corresponding to said opening portions in said second resist film overlap with each other.

19. A method of manufacturing a semiconductor device having capacitor contact holes as set forth in claim 18, wherein said regions corresponding to said opening portions in said first resist film correspond to regions where lower electrodes of capacitors are formed.

20. A method of manufacturing a semiconductor device having capacitor contact holes as set forth in claim 11, wherein each of said first and second exposure masks has openings for passing light, and said openings of said first exposure mask and said openings of said second exposure mask partially overlap with each other assuming that both said first exposure mask and said second exposure mask are superimposed.

21. A semiconductor device having capacitor contact holes manufactured by a method comprising:

preparing a semiconductor substrate;

forming an element isolation insulating film on said semiconductor substrate;

forming at least a gate electrode and source/drain regions in each of element forming regions defined by said element isolation insulating film;

forming a first insulating film to cover said gate electrode and said source/drain electrodes;

forming a second insulating film on said first insulating film;

forming a third insulating film made of material different from that of said second insulating film on said second insulating film;

forming a first resist film on said third insulating film;

patterning said first resist film by using a first exposure mask to form a patterned first resist film;

selectively removing said third insulating film by using said patterned first resist film as a mask;

forming a second resist film to cover said patterned first resist film;

patterning said second resist film by using a second exposure mask to form a patterned second resist film;

selectively removing said first and second insulating films on at least a portion of one of said source/drain regions in each of said element forming regions by using said patterned first and second resist films as a mask to form capacitor contact holes; and forming a conductive film to fill said capacitor contact holes.

22. A semiconductor device having capacitor contact holes manufactured by a method comprising:

preparing a semiconductor substrate;

forming an element isolation insulating film on said semiconductor substrate;

forming at least a gate electrode and source/drain regions in each of element forming regions defined by said element isolation insulating film;

forming a first insulating film to cover said gate electrode and said source/drain electrodes;

forming a second insulating film on said first insulating film;

forming a third insulating film made of material different from that of said second insulating film on said second insulating film;

forming a metal film on said third insulating film;

forming a first resist film on said metal film;

patterning said first resist film by using a first exposure mask to form a patterned first resist film;

selectively removing said metal film by using said patterned first resist film as a mask to form a patterned metal film;

removing remaining said first resist film;

selectively removing said third insulating film by using said patterned metal film as a mask;

forming a second resist film to cover said patterned metal film;

patterning said second resist film by using a second exposure mask to form a patterned second resist film;

selectively removing said first and second insulating films on at least a portion of one of said source/drain regions in each of said element forming regions by using said patterned second resist films and said patterned metal film as a mask to form capacitor contact holes; and forming a conductive film to fill said capacitor contact holes.

* * * * *